United States Patent
Ikeda

(10) Patent No.: US 7,595,517 B2
(45) Date of Patent: *Sep. 29, 2009

(54) CHARGE COUPLED DEVICE HAVING DIVERGED CHANNEL

(75) Inventor: Katsumi Ikeda, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 118 days.

This patent is subject to a terminal disclaimer.

(21) Appl. No.: 11/386,779

(22) Filed: Mar. 23, 2006

(65) Prior Publication Data

US 2006/0214194 A1     Sep. 28, 2006

(30) Foreign Application Priority Data

Mar. 25, 2005  (JP) .............................. 2005-089434

(51) Int. Cl.
  *H01L 27/148*  (2006.01)
(52) U.S. Cl. ............... 257/215; 257/241; 257/E33.046; 348/311
(58) Field of Classification Search ............... 257/215, 257/291, 46, 252, 254, E33.046, E29.336, 257/E31.036, 458, 292, 239–241, 440, 431, 257/421, 423; 348/311, 321, 323
See application file for complete search history.

(56) References Cited

U.S. PATENT DOCUMENTS 7,184,083 B2 *   2/2007   Yamada ...................... 348/294

FOREIGN PATENT DOCUMENTS

JP              5-308575 A      11/1993

* cited by examiner

*Primary Examiner*—Davienne Monbleau
*Assistant Examiner*—Hoa B Trinh
(74) *Attorney, Agent, or Firm*—Birch, Stewart, Kolasch & Birch, LLP

(57) ABSTRACT

A charge coupled device comprises a semiconductor substrate of one conductive type, a first charge couple device having a series of electrodes linearly arranged on the semiconductor substrate, a second charge coupled device diverged into tow lines at an end of the first charge coupled device, detectors, each of which detects a signal transferred by one of two lines of the diverged second charge coupled device, and output devices, each of which outputs the signal detected by one of the detectors, wherein a plane shape of a last electrode of the first charge coupled device connecting to the diverged second charge coupled device is a shape wherein a length of a transfer channel of the last electrode becomes shorter as going far from a right angled direction of a transfer direction of the first charge coupled device starting from a boundary part of divergence of the diverged second charge coupled device.

4 Claims, 6 Drawing Sheets

FIG. 3A
FIG. 3B
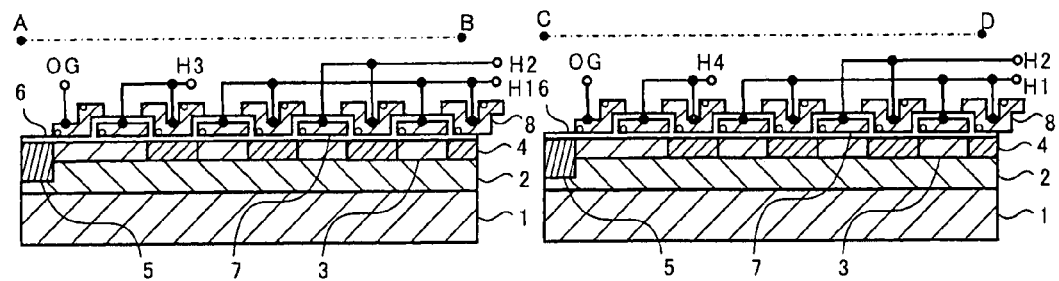
FIG. 4
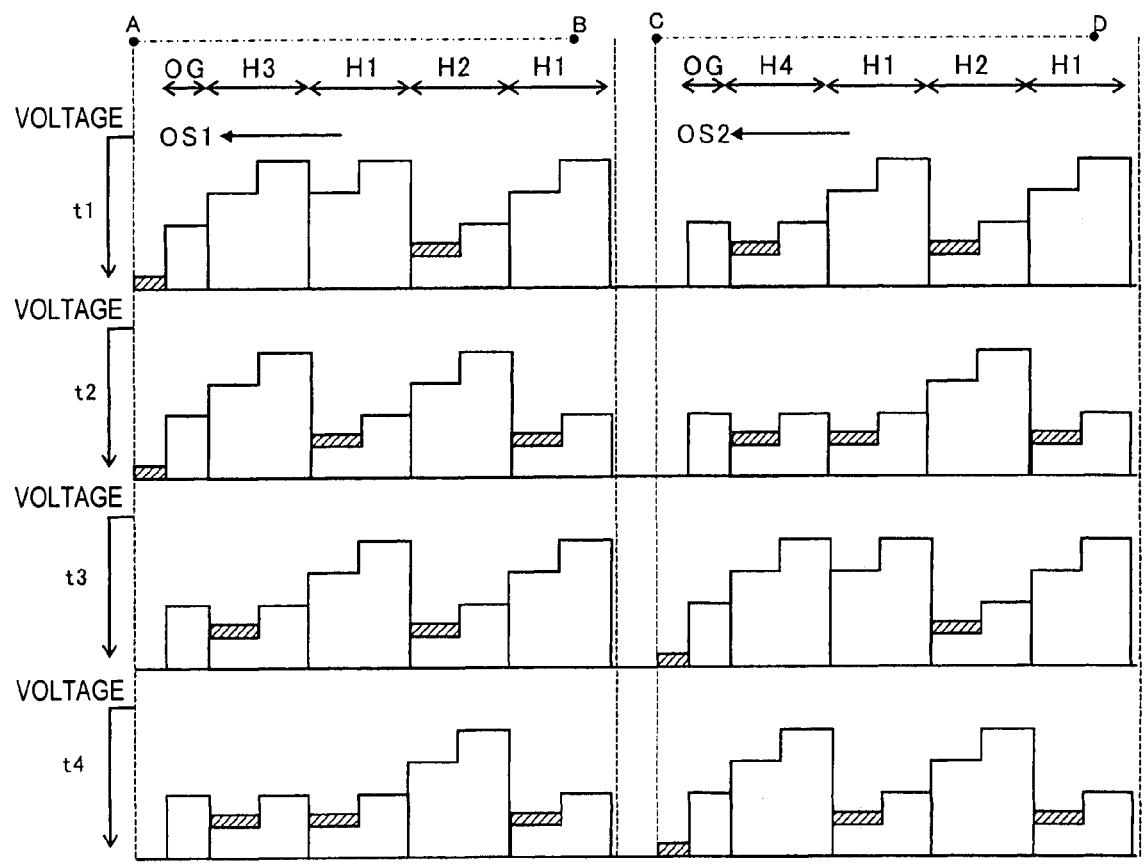

CHARGE COUPLED DEVICE HAVING DIVERGED CHANNEL

CROSS REFERENCE TO RELATED APPLICATION

This application is based on Japanese Patent Application 2005-086434, filed on Mar. 25, 2005, the entire contents of which are incorporated herein by reference.

BACKGROUND OF THE INVENTION

A) Field of the Invention

This invention relates to a charge coupled device and a solid state imaging apparatus, and especially relates to a charge coupled device arranged linearly of which channel is diverged near an edge and a solid state imaging apparatus using that.

B) Description of the Related Art

FIG. 9 is a schematic plan view of a conventional charge coupled device 60.

A charge coupled device (CCD) 60 that is arranged linearly and of which channel is diverged into two lines near an edge is consisted by including floating diffusions (FD) 5, each of which is positioned at each end of the CCD 60 after divergence and detects the transferred signal electric charge. Moreover, the charge coupled device (CCD) 60 has reset transistors RS1 and RS 2 draining the detected signal electric charge at desired timing and a reset drains RD after the FD 5.

The CCD 60 is a two-phase driving type CCD and is consisted of two phases ($\phi H1$, $\phi H2$) of electrodes (a first layer electrode 7 and a second layer electrode 8) and transfer channels 3 and 4. The transfer channel 3 under the first layer electrode 7 is formed to have deeper electric potential than the transfer channel 4 under the second transfer layer electrode 8, and the signal electric charge is temporally stored in the transfer channel 3 at a time of transferring the signal electric charge.

FIG. 10 is a diagram showing electric potential of the impurity layer 3 in the conventional charge coupled device 60 cut in a line E-F shown in FIG. 9.

As shown in the drawing, since length in a transfer direction of the CCD is almost uniform, electric potential in a direction crossing at a right angle with the transfer direction of the CCD in the impurity layer 3 is approximately flat, and the signal electric charge to be accumulated is distributed in a wide area.

Moreover, for details of the prior art, Japanese Laid-Open Patent Hei5-308575 is referenced.

FIG. 11 is a schematic view showing movements of the signal electric charges in the channel formed on the impurity layer 3 in the conventional charge coupled device 60.

As shown in the drawing, the signal electric charges in the impurity layer 3 are widely distributed, and it takes a long time to transfer them to a diverged channel. Moreover, the transfer by the thermal diffusion contributes in a flat electric potential and the electric potential is in proportion to the square of the distance.

As described in the above, if the transfer time is long at the diverged part, the solid state imaging apparatus should be driven at predetermined transfer frequency in a case that the conventional charge coupled device is used as a horizontal CCD of the solid state imaging apparatus. For example, if the transfer is not completed during the predetermined time, it will degrade transfer efficiency.

Therefore, for example, if the charge coupled device 60 is used as the horizontal CCD of the solid state imaging apparatus, horizontal flow of an image and degradation of resolution will occur. Moreover, if a color filter is laminated on a photodiode to obtain a color signal, color artifact signal may be generated.

SUMMARY OF THE INVENTION

It is an object of the present invention to improve transfer efficiency in a charge coupled device having a structure diverting at an end of the linearly arranged charge coupled device.

According to one aspect of the present invention, there is provided a charge coupled device comprises a semiconductor substrate of one conductive type, a first charge couple device having a series of electrodes linearly arranged on the semiconductor substrate, a second charge coupled device diverged into two lines at an end of the first charge coupled device, detectors, each of which detects a signal transferred by one of two lines of the diverged second charge coupled device, and output devices, each of which outputs the signal detected by one of the detectors, wherein a plane shape of a last electrode of the first charge coupled device connecting to the diverged second charge coupled device is a shape wherein a length of a transfer channel of the last electrode becomes shorter as going far from a right angled direction of a transfer direction of the first charge coupled device starting from a boundary part of divergence of the diverged second charge coupled device.

According to the present invention, transfer efficiency can be improved in the charge coupled device having the structure diverting at the end of the linearly arranged charge coupled device.

BRIEF DESCRIPTION OF THE DRAWINGS

FIG. 3A and FIG. 3B are partial cross sectional views of the solid state imaging apparatus 100 in FIG. 1.

FIG. 4 is a potential diagram for explaining diverging drive at timing t1 to timing t4 in FIG. 2 at A-B and c-d in FIG. 1.

DETAILED DESCRIPTION OF THE PREFERRED EMBODIMENTS

Figure 1:
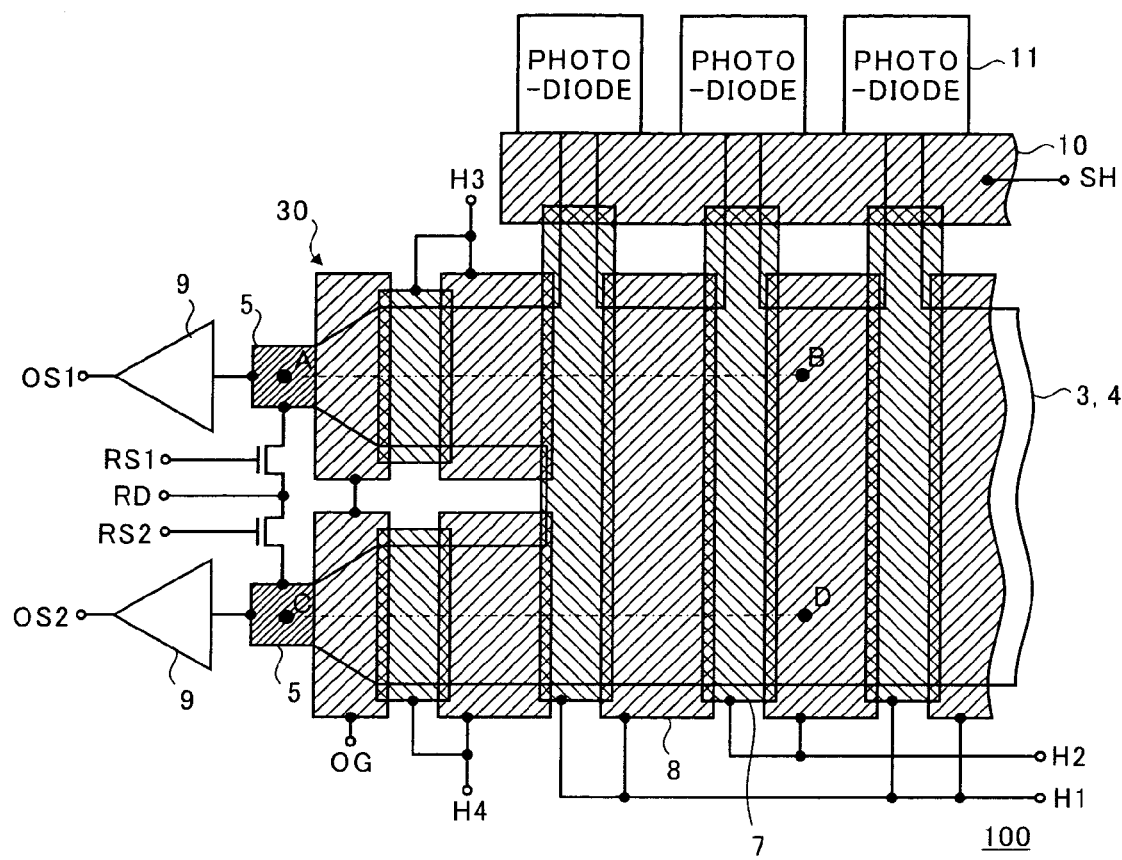
FIG. 1 is a schematic plan view of a solid state imaging apparatus 100 according to a first embodiment of the present invention.

FIG. 1 is a schematic plan view of a solid state imaging apparatus 100 according to a first embodiment of the present invention.

The solid state imaging apparatus 100 is consisted of a plurality of linearly arranged photo conversion elements (photodiodes) 11, a line memory 10 that temporally accumulates signal electric charges read out from the photodiodes 11, the charge coupled device (CCD) 30 arranged linearly and of which a channel is diverted into two lines near an edge, a floating diffusions (FD) 5 each of which is positioned at each end of the CCD 30 after the divergence and detects the transferred signal electric charges, and an output circuits (output amplifier) 9 each of which detects electric potential change of the FD 5 to output. Moreover, the FDs 5 have reset transistors RS1 and RS2 draining the detected signal electric charges at a desired timing and a reset drain RD. Moreover, the line memory 10 may be omitted.

The CCD 30 is a two-phase driving type CCD and consisted of two phases ($\phi$H1, $\phi$H2) of two electrodes (the first layer electrode 7 and the second layer electrode 8) and transfer channels 3 and 4. The transfer channel 3 under the first layer electrode 7 is formed to have deeper electric potential than that of the transfer channel 4 under the second transfer layer electrode 8, and the signal electric charges are temporally stored in the transfer channel 3 at a time of transferring the signal electric charges.

In the embodiment of the present invention, an output gates (OG) are impressed with a fixed voltage, and the electrodes 7 and 8 after the channel divergence are controlled by $\phi$H3 and $\phi$H4. Also, in the embodiment of the present invention, each OG preceding each FD 5 is bent to match with the size of the FD 5 in order to impose an electric field crossing with the transfer direction at a right angle with making the FD 5 small and keeping the transfer efficiency.

Figure 2:
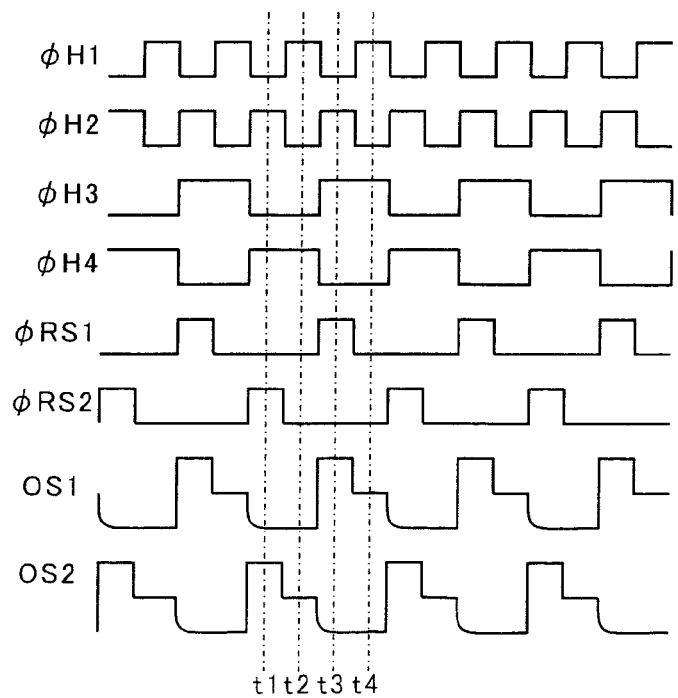
FIG. 2 is a timing chart for driving a charge coupled device (CCD) 30 of the solid state imaging apparatus 100 shown in FIG. 1.

FIG. 2 is a timing chart for driving the charge coupled device (CCD) 30 of the solid state imaging apparatus 100 shown in FIG. 1.

$\phi$H1 and $\phi$H2 are two-value pulse inverted to each other at about 50% of a duty ratio (a periodic rate of the high level voltage imposed during a cycle time) and imposed respectively to the electrodes H1 and H2 in FIG. 1. $\phi$H3 and $\phi$H4 are two-value pulse inverted to each other at about 50% of a duty ratio and driven at a frequency of $\phi$H1 and $\phi$H2 divided by two to be imposed respectively to the electrodes H3 and H4 in FIG. 1.

$\phi$RS1 and $\phi$RS2 have same frequency as $\phi$H3 and $\phi$H4; however, $\phi$RS1 agrees with $\phi$H3 at the starting part at about 25% of a duty ratio, and $\phi$RS2 agrees with $\phi$H4 at the starting part at about 25% of a duty ratio. $\phi$RS1 and $\phi$RS2 are imposed respectively to the RS1 and the RS2 in FIG. 1.

FIG. 3A and FIG. 3B are partial cross sectional views of the solid state imaging apparatus 100 in IFG. 1. FIG. 3A is a cross sectional view at a part indicated with a line A-B in FIG. 1, and FIG. 3B is a cross sectional view at a part indicated with a line C-D in FIG. 1.

On a surface layer side of one conductive type semiconductor substrate 1, a well layer 2 having another conductive type of the substrate is formed, and impurity layers (transfer channels) 3 and 4 having a conductive type inverting that of the well layer 2 are formed on the surface of the substrate in the well layer 2. The impurity layer 4 is relatively thinner than the impurity layer 3. Moreover, a diffusion layer (floating diffusion) 5 is formed on an edge in a horizontal direction (on a left side in the drawing) of the impurity layers 3 and 4. The first electrodes 7 are formed on the substrate 1 via the insulating layer 6, and the second electrodes 8 are formed on the substrate 1 and a part of the electrodes 7 via the insulating layer 6. The impurity layer 3 is formed under the OG. In other parts, the impurity layer 3 is formed under the electrode 7, and the impurity layer 4 is formed under the electrode 8. The first electrode 7 and the second electrode 8 are electrically connected each other, and a well-known operation of the two-phase driving CCD is realized by the inputs (driving voltages) shown in FIG. 2.

FIG. 4 is a potential diagram for explaining diverging drive at timing t1 to timing t4 in FIG. 2 at A-B and C-D in FIG. 1. In the drawing, a square with slash represents the accumulated signal electric charges.

As obvious from the drawing, the signal electric charges transferred by the H1 and the H2 are distributed and transferred to the OS 1 or the OS 2 by controlling the H3 and H4 at the cycle of the H3 and the H4 which are twice of the driving cycle of the H1 and the H2.

As described in the above, according to the first embodiment of the present invention, the transfer efficiency from the output gate to the floating diffusion can be improved in the charge coupled device having the structure diverted at the end of the linearly arranged charge coupled device.

Figure 5:
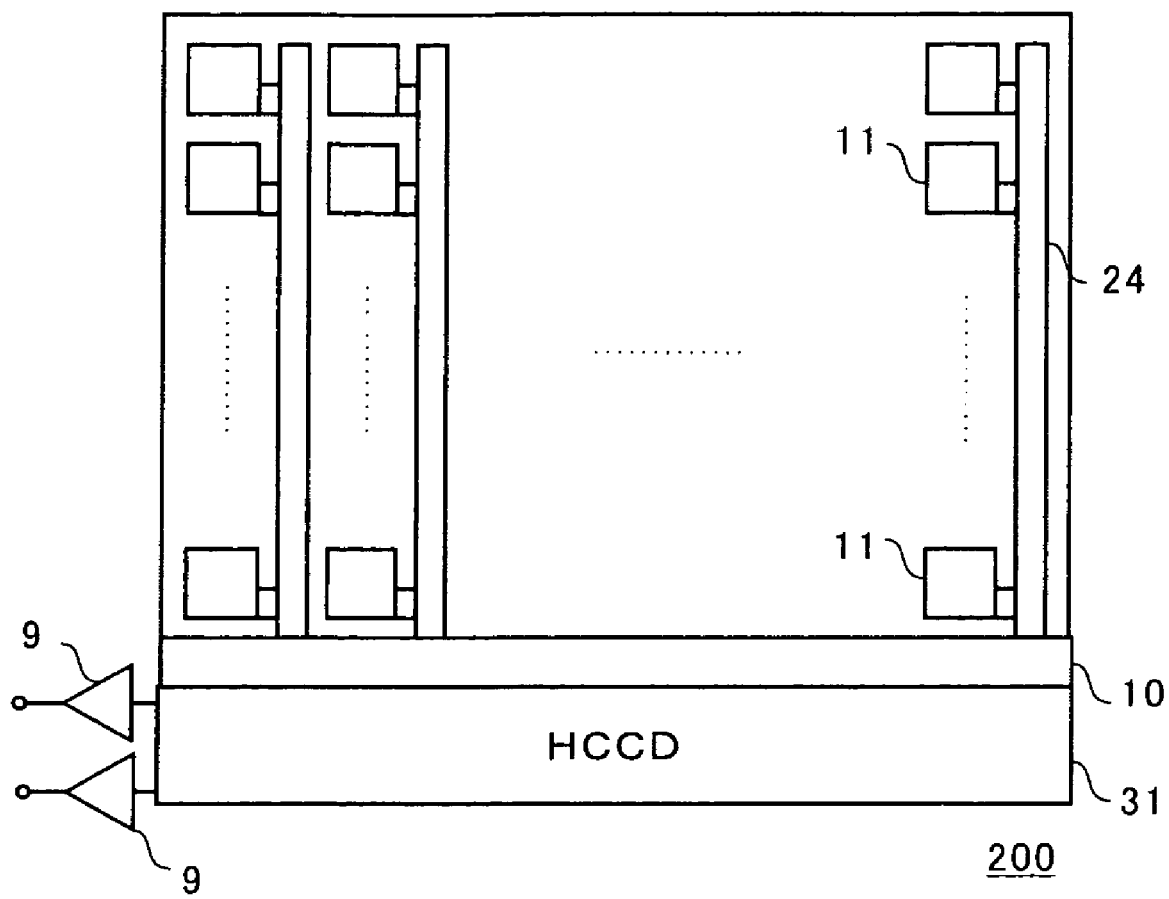
FIG. 5 is a schematic plan view of a solid state imaging apparatus according to a second embodiment of the present invention.

FIG. 5 is a schematic plan view of the solid state imaging apparatus 200 according to a second embodiment of the present invention.

The solid state imaging apparatus 200 is a so-called interline type CCD (ITCCD). A large number of photoelectric conversion elements (pixels) 11 are arranged in a tetragonal matrix in a light receiving region 20. Vertical electric charge transfer devices (VCCD) 24, each of which reads out a signal electric charge generated in a column of the photoelectric conversion elements 11 to transfer to the vertical direction and is formed with including transfer electrodes and a vertical transfer channel between each of the columns of the photoelectric conversion elements 11, and the signal electric charges generated in the photoelectric conversion elements 11 are transferred to the vertical direction. A line memory 10 that temporally accumulates the signal electric charges transferred from the VCCD 24 is positioned at the end of the VCCD 24. Moreover, a horizontal electric charge transfer device (HCCD) 31 that selectively receives the signal electric charges from the line memory 10 to transfer to the horizontal direction, and an output amplifier (output circuit) 9 that converts the signal electric charges to voltage to output are positioned under the line memory 10. Moreover, in the embodiment of the present invention, as described in the above, since the channel is diverted into two lines near the edge of the HCCD 31, two lines of the output amplifiers 9 are arranged. Also, the line memory can be omitted.

Figure 6:
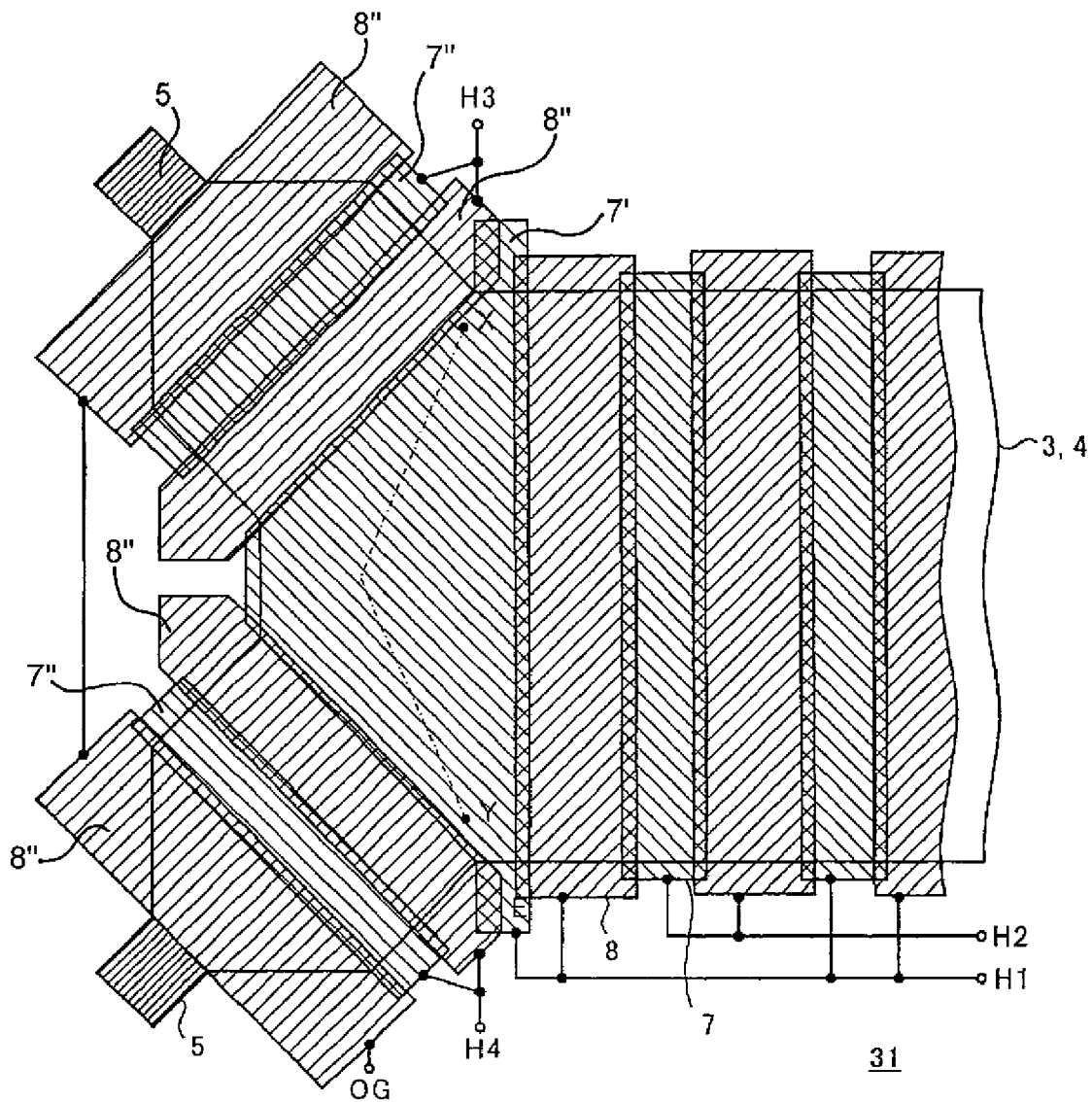
FIG. 6 is a schematic plan view of a charge coupled device (HCCD) 31 shown in FIG. 5.

FIG. 6 is a schematic plan view of the charge coupled device (HCCD) 31 shown in FIG. 5.

Differences from the charge coupled device 30 according to the first embodiment in FIG. 1 of the present invention are plan shapes of an electrode 7' and the impurity layer 3 arranged linearly at the edge of the charge coupled device 31. The shape of that part is characterized by that the length of the transfer channels become shorter as the charge coupled devices (H1, H2) going far from the boundary part of the diverged channels at a right angle of the transfer direction. With this structure, the signal charge to be accumulated can be concentrated in the center by forming a slope of the electrical potential toward the center in a direction of crossing to the transfer direction of the CCD at a right angle in the impurity layer 3 under the edge electrode.

In FIG. 1, a single charge coupled device having one channel is divided into two channels near the output gates OG. The output circuits 9 each detect transferred charge accumulated at each floating diffusion FD 5. In the FIG. 6 embodiment, a first charge coupled device has a series of electrodes 7 and 8 linearly arranged on the semiconductor substrate 1. A second charge coupled device having a series of electrodes 7" and 8", diverges into two lines at the end of the first charge coupled device. As can be seen in FIG. 6, each of the two lines of the second charge coupled device ends in a floating diffusion 5. The floating diffusions 5 serve to detect a signal transferred by one of the two lines of the diverged second charge coupled device. The last electrode 7' of the first charge coupled device has a plane shape connecting the first charge coupled device to the second charge coupled device wherein the length of the transfer channel of the last electrode becomes shorter the further the distance is from the boundary. That is, the last electrode 7' of the first charge coupled device serves as the connection between the first and second charge coupled devices and is shaped such that the width of the transfer channel becomes narrower in width the further the transfer channel is from the first charge coupled device moving toward the second charge coupled device.

Since other structures are the same as the charge coupled device 30 according to the first embodiment of the present invention in FIG. 1 and FIG. 3, the explanations for them will be omitted. Also, the charge coupled device according to the second invention can be driven by the timing chart shown in FIG. 2, and the signal charges transferred by the H1 and H2 are distributed and transferred to the OS1 and OS2 sides at frequency of the H3 and H4 which are twice of the driving cycle of the H1 and H2 by controlling the H3 and H4

Figure 7:
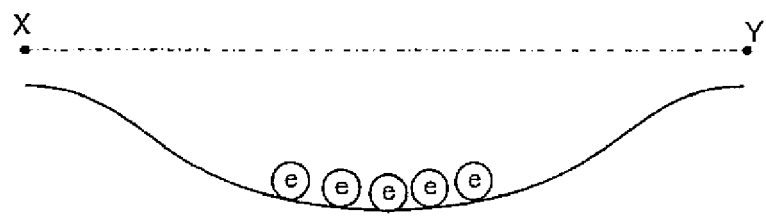
FIG. 7 is a diagram showing electric potential of an impurity layer 3 of a part indicated with X-Y in FIG. 6.

FIG. 7 is a diagram showing electrical potential of the impurity layer 3 at a part indicated with a line X-Y in FIG. 6.

Obviously from the drawing, the electric potential becomes shallow as the channel width under the electrode getting narrow to the edge from around the center of the impurity layer 3 as a boundary. This is according to the so called narrow channel effect, wherein the electric potential becomes shallow under the influence of the fringe electric field of the electric potential under the electrodes adjacent to each other when the electric potential under the electrodes adjacent to each other is shallow and the length of which is short. Therefore, under the second electrode on the opposite side of the divergence side is formed of the impurity layer 4, and the electric potential is shallow regardless of the voltage of the H1. The depth of the electric potential on the divergence side differs depending on the timing. For example, the narrow channel effect is hard to occur in the H3 at a time of imposing high voltage. As described in the above, in the structure of the second embodiment, the signal electric charges gather near the channel boundary.

Figure 8A:
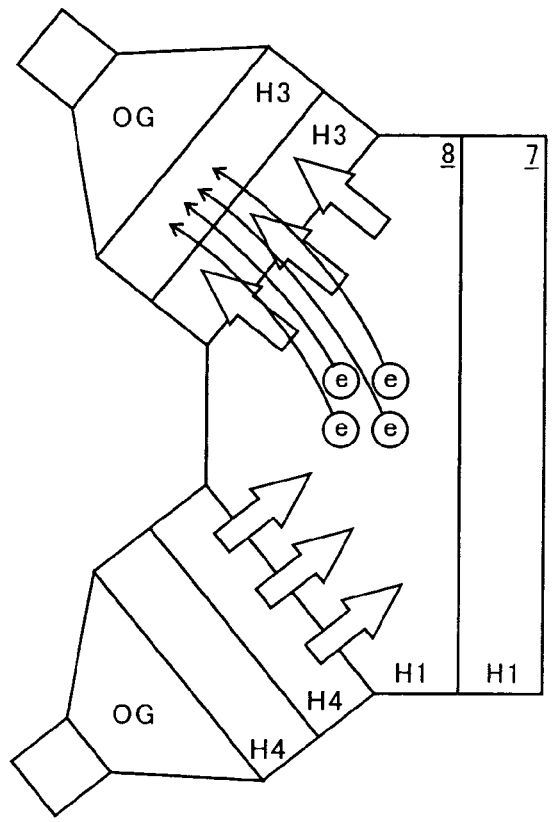
FIG. 8A and FIG. 8B are schematic views showing movements of signal electric charges in a channel formed on the impurity layer according to the second embodiment of the present invention.
Figure 8B:
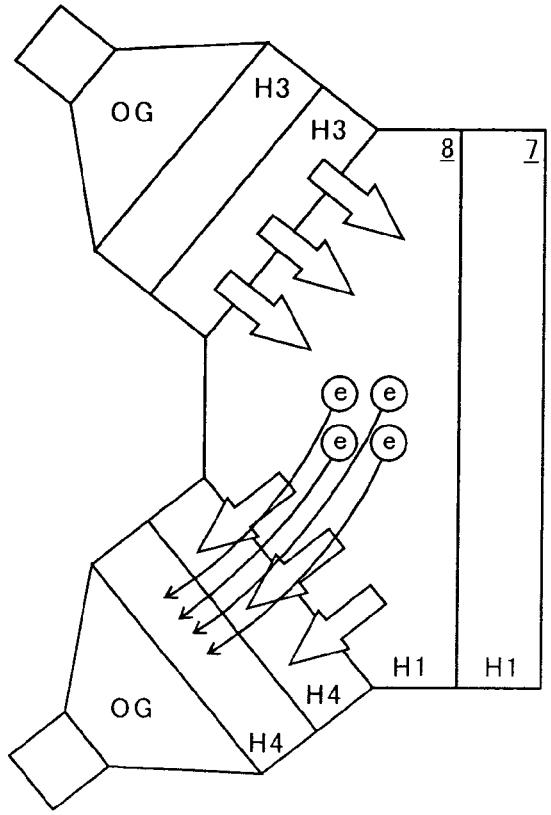
Figure 9:
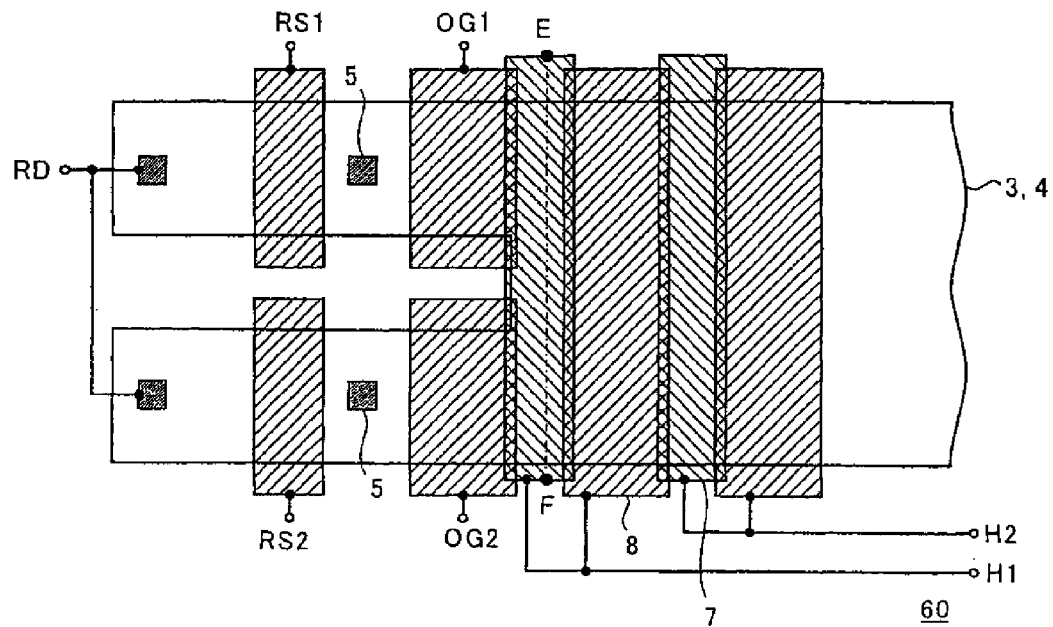
FIG. 9 is a schematic plan view of a conventional charge coupled device 60.
Figure 10:
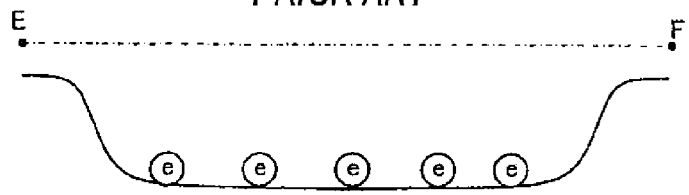
FIG. 10 is a diagram showing electric potential of the impurity layer 3 in the conventional charge coupled device 60 cut in a line E-F shown in FIG. 9.
Figure 11A:
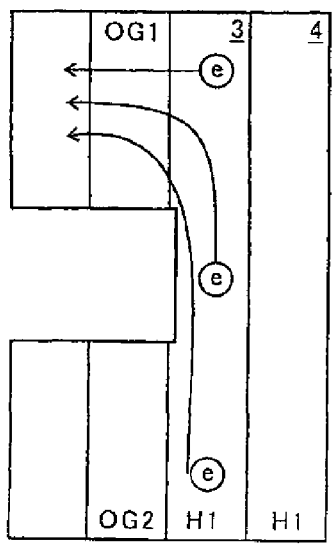
FIG. 11 is a schematic view showing movements of signal electric charges of the channel formed on the impurity layer 3 in the conventional charge coupled device 60.
Figure 11B:
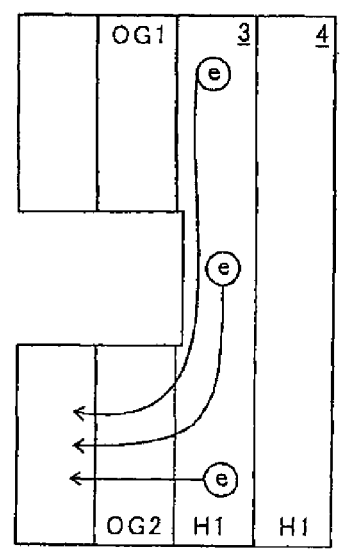

FIG. 8A and 8B are schematic views showing movements of signal electric charges in the channel formed in the impurity layer according to the second embodiment of the present invention. FIG. 8A is movements of the signal charges at a time of transfer to the OS1 direction. FIG. 8B is movements of the signal electric charges at a time of transfer to the OS2 direction.

As shown in the drawing, the signal electric charges in the impurity layer 3 of the H1 are distributed around the center area under the H1 electrode, the transfer time to the divergence channel can be shortened as compared to the conventional technique. Moreover, when the signal electric charges are transferred to the H3 (timing t1 shown in FIG. 2), an expulsion drift electric field is formed to a direction indicated with an arrow from the H4, and a pulling drift electric field is formed to a direction indicated with an arrow to the H3. By that, the transfer efficiency to the H3 can be improved further. Also, as same as the above, when the signal electric charges are transferred to the H4 (timing t3 shown in FIG. 2), the expulsion drift electric field is formed to a direction indicated with an arrow from the H3 and the pulling drift electric field is formed to a direction indicated with an arrow to the H4. By that, the transfer efficiency to the H3 can be improved further.

As described in the above, according to the second embodiment of the present invention, in the charge coupled device having the structure diverted at the edge of the charge coupled device arranged linearly, the transfer time to the diverting part can be shortened, and the transfer efficiency can be improved.

Therefore, for example, when the charge coupled device according to the second embodiment of the present invention is used as a horizontal CCD of the solid state imaging apparatus arranged in two-dimension, the horizontal flow of an image and degradation of resolution can be prevented. Also, when a color filter is laminated on the photodiode to obtain the color signal, an image with good quality without generating color artifact and the like can be provided.

Although the first embodiment uses the line sensor and the second embodiment uses the area sensor, the charge coupled device 30 according to the first embodiment may be applied to the area sensor according to the second embodiment. Similarly, the charge coupled device 31 according to the second embodiment may be applied to the line sensor according to the first embodiment.

The present invention has been described in connection with the preferred embodiments. The invention is not limited only to the above embodiments. It is apparent that various modifications, improvements, combinations, and the like can be made by those skilled in the art.

What are claimed are:

1. A charge coupled device, comprising:
a semiconductor substrate of one conductive type;
a first charge coupled device having a series of electrodes linearly arranged on the semiconductor substrate and ending in a last electrode at one end remote from another end;
a second charge coupled device diverged into two lines at an end of the first charge coupled device;
said last electrode connecting the one end of the first charge coupled device to the second charge coupled device;
detectors, each of which detects a signal transferred by one of two lines of the diverged second charge coupled device; and
output devices, each of which outputs the signal detected by one of the detectors,
wherein the last electrode of the first charge coupled device connecting to the diverged second charge coupled device is shaped such that the width of a transfer channel of the last electrode becomes narrower in width the further the transfer channel is from the end of the first charge coupled device in the direction of the diverged second charge coupled device.

2. The charge coupled device according to claim 1, wherein the last electrode of the first charge coupled device forms a slope of a electrical potential toward a center of the last electrode.

3. A charge coupled device, comprising:
a semiconductor substrate of one conductive type;
a first charge couple device having a series of electrodes linearly arranged on the semiconductor substrate;
a second charge coupled device diverged into two lines at an end of the first charge coupled device;

detectors, each of which detects a signal transferred by one of two lines of the diverged second charge coupled device; and output devices, each of which outputs the signal detected by one of the detectors, wherein a last electrode of the first charge coupled device connecting to the diverged second charge coupled device has a width that becomes narrower in a direction toward the output devices.

4. A charge coupled device, comprising:

a semiconductor substrate of one conductive type;

a first charge couple device having a series of electrodes linearly arranged on the semiconductor substrate;

a second charge coupled device diverged into two lines at an end of the first charge coupled device;

detectors, each of which detects a signal transferred by one of two lines of the diverged second charge coupled device; and output devices, each of which outputs the signal detected by one of the detectors, wherein a portion of a last electrode of the first charge coupled device connecting to the diverged second charge coupled device has a shape of a truncated cone.

* * * * *